US010429425B2

(12) United States Patent
Wang et al.

(10) Patent No.: US 10,429,425 B2
(45) Date of Patent: *Oct. 1, 2019

(54) METHOD FOR DETECTING SURFACE ELECTRIC FIELD DISTRIBUTION OF NANOSTRUCTURES

(71) Applicants: Tsinghua University, Beijing (CN); HON HAI PRECISION INDUSTRY CO., LTD., New Taipei (TW)

(72) Inventors: Jiang-Tao Wang, Beijing (CN); Peng Liu, Beijing (CN); Yang Wei, Beijing (CN); Kai-Li Jiang, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 182 days.

This patent is subject to a terminal disclaimer.

(21) Appl. No.: 15/598,227

(22) Filed: May 17, 2017

(65) Prior Publication Data

US 2017/0336456 A1  Nov. 23, 2017

(30) Foreign Application Priority Data

May 20, 2016  (CN) .......................... 2016 1 0336945

(51) Int. Cl.
*G01R 29/14* (2006.01)
*G01R 29/24* (2006.01)
(Continued)

(52) U.S. Cl.
CPC ............. *G01R 29/14* (2013.01); *G01R 29/24* (2013.01); *G01R 5/28* (2013.01); *G01R 15/165* (2013.01);
(Continued)

(58) Field of Classification Search
CPC ........ G01R 29/00; G01R 29/08; G01R 29/12; G01R 29/14; G01R 29/24; G01R 5/00;
(Continued)

(56) References Cited

U.S. PATENT DOCUMENTS 7,315,173 B2 * 1/2008 Funato ............... G01R 29/0814
324/452
10,011,488 B2  7/2018 Jiang et al.
(Continued)

FOREIGN PATENT DOCUMENTS

CN  101279372  10/2008
CN  101352669  1/2009
(Continued)

OTHER PUBLICATIONS

Plasma-induced alignment of carbon nanotubes; Bower et al.; Applied Physics Letters; vol. 77, No. 9; p. 830-832; Aug. 7, 2000.
(Continued)

*Primary Examiner* — Hoai-An D. Nguyen
(74) *Attorney, Agent, or Firm* — ScienBiziP, P.C.

(57) ABSTRACT

The disclosure relates to a method for detecting surface electric field distribution of nanostructures. The method includes the following steps of: providing a sample located on an insulated surface of a substrate; spraying first charged nanoparticles to the insulated surface; and blowing vapor to the insulated surface to observe a distribution of the first charged nanoparticles via an optical microscope.

11 Claims, 11 Drawing Sheets

(51) Int. Cl.
- *G01R 15/16* (2006.01)
- *G01R 33/10* (2006.01)
- *G01R 29/12* (2006.01)
- *G01R 29/08* (2006.01)
- *G01R 5/28* (2006.01)
- *G01R 19/00* (2006.01)

(52) U.S. Cl.
CPC .......... *G01R 19/0023* (2013.01); *G01R 29/08* (2013.01); *G01R 29/12* (2013.01); *G01R 33/10* (2013.01)

(58) Field of Classification Search
CPC .......... G01R 5/28; G01R 15/00; G01R 15/16; G01R 15/165; G01R 19/00; G01R 19/0023; G01R 33/00; G01R 33/02; G01R 33/10
USPC ........................ 324/457, 76.11, 109; 204/164
See application file for complete search history.

(56) References Cited

U.S. PATENT DOCUMENTS

| | | | |
|---|---|---|---|
| 10,132,767 | B2* | 11/2018 | Wang .................. G01N 27/041 |
| 2002/0123230 | A1 | 9/2002 | Hubacek |
| 2007/0059370 | A1 | 3/2007 | Chou et al. |
| 2007/0281086 | A1 | 12/2007 | Hsiao |
| 2015/0211980 | A1 | 7/2015 | Wang et al. |
| 2016/0009552 | A1* | 1/2016 | Ressier ............... B81C 1/00373 307/400 |
| 2016/0023903 | A1 | 1/2016 | Jiang et al. |
| 2016/0023908 | A1 | 1/2016 | Jiang et al. |

FOREIGN PATENT DOCUMENTS

| | | |
|---|---|---|
| CN | 102329527 | 1/2012 |
| CN | 102936010 | 2/2013 |
| CN | 104692357 | 6/2015 |
| CN | 104808325 | 7/2015 |
| CN | 105439114 | 3/2016 |
| TW | 200711722 | 4/2007 |
| TW | I372188 | 9/2012 |
| TW | I386511 | 2/2013 |
| TW | 201604129 | 2/2016 |
| TW | 201604130 | 2/2016 |

OTHER PUBLICATIONS

Spatially Selective Guided Growth of High-Coverage Arrays and Random Networks of Single-Walled Carbon Nanotubes and their Integration into Electronic Devices; Kocabas et al.; J. Am. Chem. Soc. 2006, 128, 4540-4541; Mar. 22, 2006.

Fabrication of Ultralong and Electrically Uniform Single-Walled Carbon Nanotubes on Clean Substrates; Wang et al.; Nano Letters 2009, vol. 9,No. 9; 3137-3141; Aug. 3, 2009.

Ke Chang et al., Imaging of Ferroelectric Domains by Charged Nano particle Decoration Method, Journal of Synthetic Crystals, Oct. 31, 2006, 958-962, vol. 35, No. 5.

* cited by examiner

METHOD FOR DETECTING SURFACE ELECTRIC FIELD DISTRIBUTION OF NANOSTRUCTURES

CROSS-REFERENCE TO RELATED APPLICATIONS

This application claims all benefits accruing under 35 U.S.C. § 119 from China Patent Application No. 201610336945.X, filed on May 20, 2016, in the China Intellectual Property Office. This application is related to commonly-assigned application entitled, "DEVICE FOR MAKING CHARGED NANOPARTICLES", concurrently filed Ser. No. 15/598,218; "METHOD FOR CALCULATING SURFACE ELECTRIC FIELD DISTRIBUTION OF NANOSTRUCTURES", concurrently filed Ser. No. 15/598,223. Disclosures of the above-identified applications are incorporated herein by reference.

BACKGROUND

1. Technical Field

The subject matter herein generally relates to a method for visualization surface electric field distribution of nanomaterials and especially relates to a method for visualization surface electric field distribution of nanomaterials with an optical microscope.

2. Description of Related Art

With the development of nanotechnology, charges stored or transferred in nanomaterials play an important role in the performance of some unique properties. Electrostatic force microscope (EFM) is used to characterize the surface charge distribution on the nanoscale. However, in some cases, 1-D nanomaterials with the absolute potential of the charged area are not quantitative in an EFM image. As to some individual nanostructures and large scaled surface charge distribution, EFM is difficult to find the specimens and is often time-consuming because of the slow scanning process.

What is needed, therefore, is to provide a method for detecting the surface charge distribution in nanostructures and nanomaterials which can overcome the shortcomings as described above.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale, and the proportions of certain parts may be exaggerated to be better illustrate details and features. The description is not to considered as limiting the scope of the embodiments described herein.

Several definitions that apply throughout this disclosure will now be presented.

The connection can be such that the objects are permanently connected or releasably connected. The term "outside" refers to a region that is beyond the outermost confines of a physical object. The term "inside" indicates that at least a portion of a region is partially contained within a boundary formed by the object. The term "substantially" is defined to essentially conforming to the particular dimension, shape or other word that substantially modifies, such that the component need not be exact. For example, substantially cylindrical means that the object resembles a cylinder, but can have one or more deviations from a true cylinder. The term "comprising" means "including, but not necessarily limited to"; it specifically indicates open-ended inclusion or membership in a so-described combination, group, series and the like. It should be noted that references to "an" or "one" embodiment in this disclosure are not necessarily to the same embodiment, and such references mean at least one.

References will now be made to the drawings to describe, in detail, various embodiments of the present epitaxial structures and methods for making the same.

Figure 1:
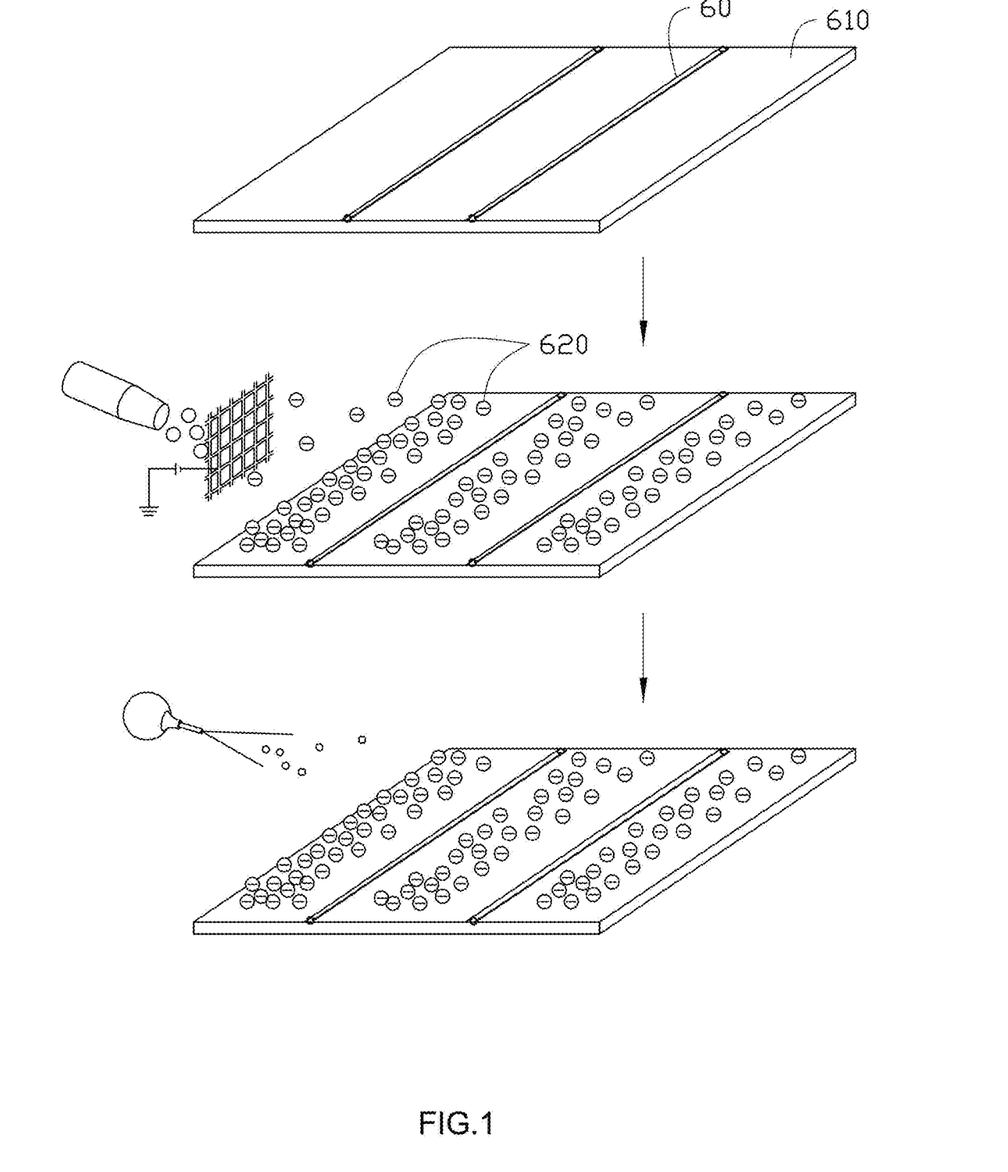
FIG. 1 is a schematic view of one embodiment of a method for detecting surface electric field distribution of nanostructures.

Referring to FIG. 1, a method for detecting surface, electric field distribution of nanostructures of one embodiment is provided. The method comprises the steps of:

step (S11), providing a nanostructure sample 60 located on an insulated layer 614 of a substrate 610;

step (S12), spraying first charged nanoparticles 620 to the insulated layer 614; and step (S13), blowing vapor to the insulated layer 614 to observe the distribution of the first charged nanoparticles 620 via an optical microscope.

In step (S11), the nanostructure sample 60 can be any pattern with a nanostructure. For example, the nanostructure sample 60 can be zero-dimensional nanomaterials, one-dimensional nanomaterials, or two-dimensional nanomaterials.

In one embodiment, the nanostructure sample 60 comprises ultra-long carbon nanotubes horizontally aligned on the substrate 614. The diameter of the ultra-long carbon nanotubes can range from about 0.5 nanometers to about 10 nanometers. The length of the ultra-long carbon nanotubes is equal to or larger than 50 micrometers.

The substrate 610 has an insulated layer 614 so that charges cannot transfer from the nanostructure sample 60 to the substrate 610.

In one embodiment, the substrate 610 can be a silicon substrate with a silicon dioxide layers located on the surface of the silicon substrate. The thickness of the silicon dioxide layers is about 0.1 micrometers to about 1 micrometer.

In step (S12), the pie-charged nanoparticles 620 are sprayed to the insulated layer 614 uniformly. The diameter of the pre-charged nanoparticles 620 can range from about 0.5 nanometers to about 5 nanometers. The first charged nanoparticles 620 are all positively charged or all negatively charged. The first charged nanoparticle 620 can be crystals difficult to sublimate, for example, charged glucose nanoparticles, charged sucrose nanoparticles, charged metal salt nanoparticles, or the like. The anions of the charged metal salt nanoparticles can be chloride, nitrate, sulfate, and the metal cations can be Na﹑K﹑Ca﹑Fe. In one embodiment, the first charged nanoparticles 620 are charged NaCl nanoparticles.

In step (S13), the vapor can be water vapor or ethanol vapor. When the vapor reaches the insulated layer 614, the vapor would condense into micro-droplets which are attached to the nanostructure sample 60 and the first charged nanoparticle 620. Under oblique illumination light, the micro-droplets will act as scattering centers, appearing as bright dots under a dark-field optical microscope. Thus, the nanostructure sample 60 and the first charged nanoparticle 620 are observed by the optical microscope.

Like charges repel each other, but opposite charges attract due to Coulomb interaction. If the first charged nanoparticles 620 and the nanostructure sample 60 have the same sign, the electrostatic force between them is repulsive, the first charged nanoparticles 620 will avoid the nanostructure sample 60. If the first charged nanoparticles 620 and the nanostructure sample 60 have different signs, the force between them is attractive, the first charged nanoparticles 620 will aggregate at the nanostructure sample 60. Thus an image of surface charge distribution will be delineated by the first charged nanoparticles 620.

Figure 5:
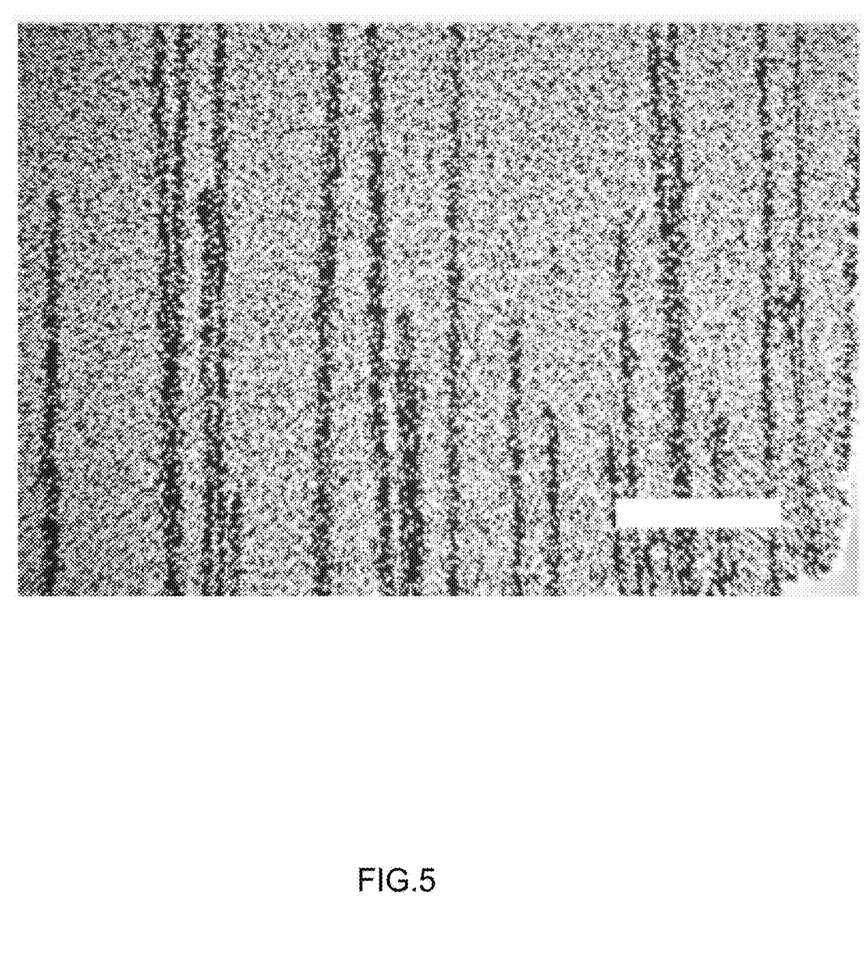
FIG. 5 is an optical image of ultra-long, carbon nanotubes taken by the method for detecting surface electric field distribution of nanostructures of FIG. 1.
Figure 6:
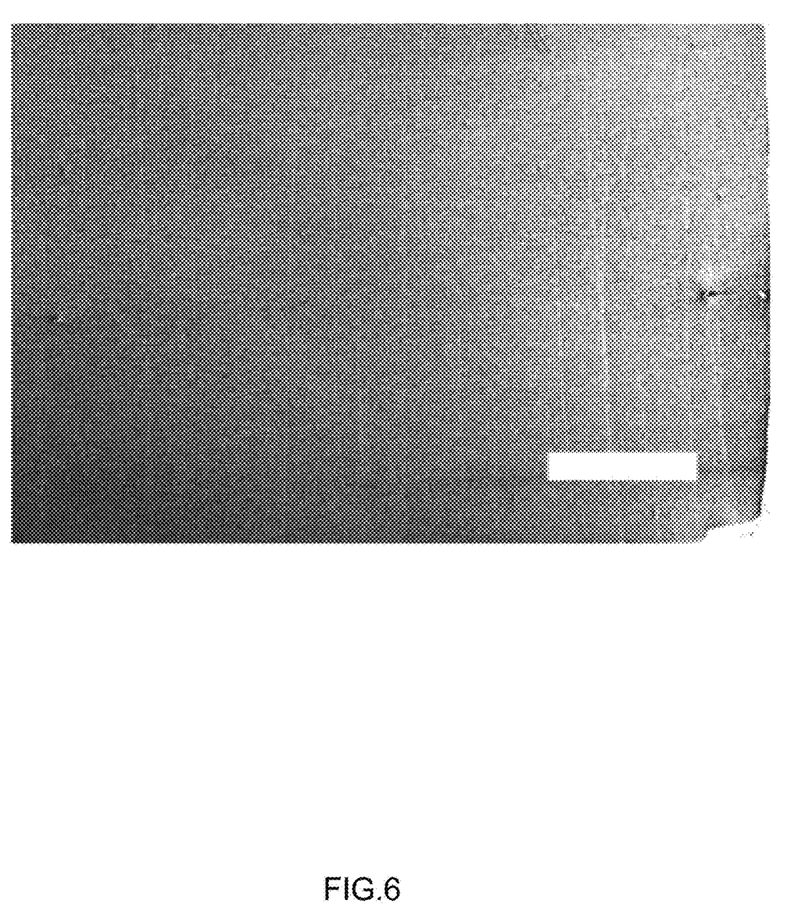
FIG. 6 is a scanning electron microscope (SEM) image of the ultra-long carbon nanotubes in FIG. 5.

Referring to FIG. 5 and FIG. 6, the first charged nanoparticles 620 avoid the nanostructure sample 60, so the first charged nanoparticles 620 and the nanostructure sample 60 have the same sign.

Figure 2:
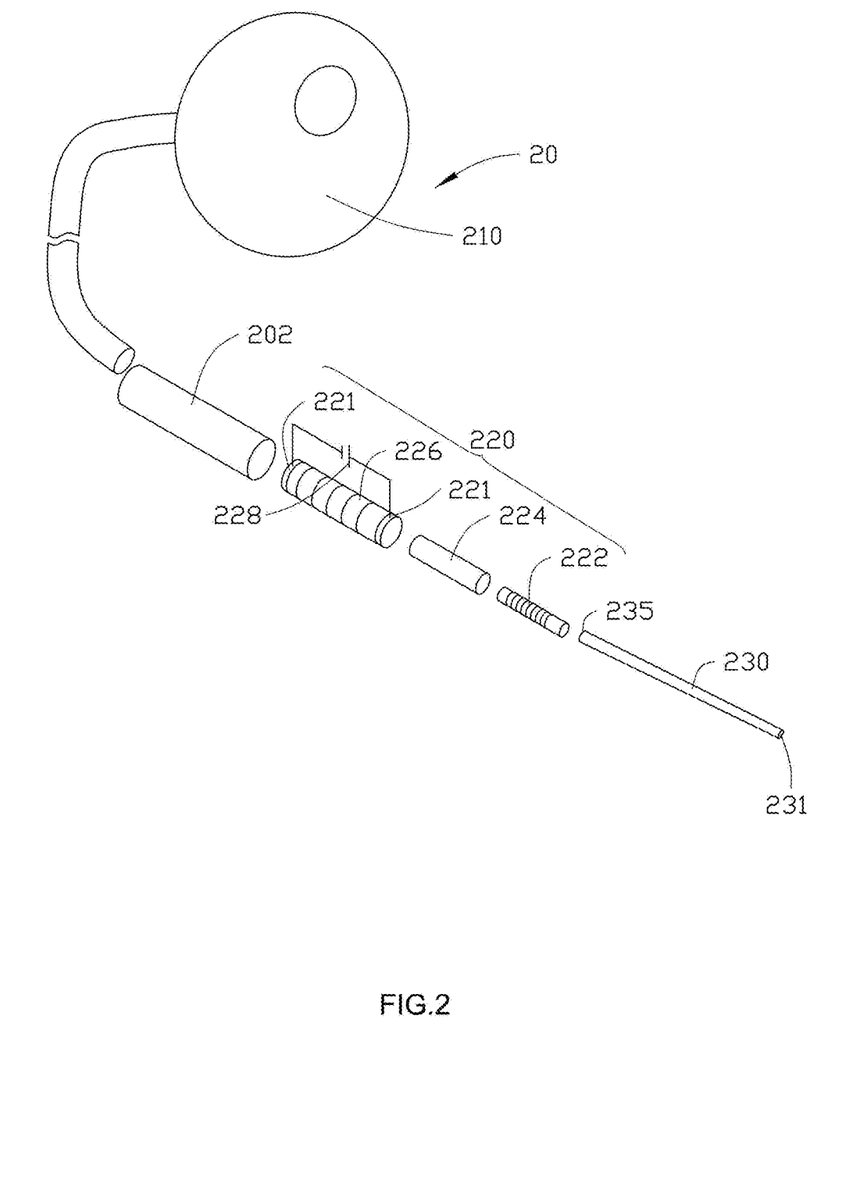
FIG. 2 is an exploded view of one embodiment of a vapor-condensation-assisted device.

The method of providing the vapor is not limited. In one embodiment, the vapor is produced via a vapor-condensation-assisted device 20. Referring to FIG. 2, the vapor-condensation-assisted device 20 comprises an air blowing device 210, a vapor producing device 220 and a guide pipe 230. The air blowing device 210 is connected to the vapor producing device 220 and can blow air into the vapor producing device 220. The vapor producing device 220 is connected to the guide pipe 230. The air can blow from the air blowing device 210 into the vapor producing device 220 and out of the guide pipe 230. The vapor produced in the vapor producing device 220 can be blown to the surface 614 by the blowing air from the air blowing device 210.

The air blowing device 210 can be a flexible bulb that is able to inhale or exhale the air by pressing. The air bowling device 210 is connected to the vapor producing device 220. The air can be blown into the vapor producing device 220 by the air blowing device 210. In one embodiment, the air blowing device 210 is a rubber suction bulb.

The vapor producing device 220 comprises a liquid absorbing material 222, a hollow tube 224, a heating layer 226 and a power source 228. The liquid absorbing material 222 is located in the hollow tube 224, but does not affect the ventilation performance of the hollow tube 224. A liquid material is absorbed by the liquid absorbing material 222. The heating layer 226 is surrounded the out surface of the hollow tube 224 and electrical connected to the power source 228. The heating layer 226 is used to heat the liquid absorbing material 222 located in the hollow tube 224.

A material of the hollow tube 224 is not limited, and can be soft or hard materials. The hard material can be ceramic, glass, or quartz. The soft material can be resin, rubber, plastic or flexible fiber. The cross-section shape of the hollow tube 224 is not limited, and can be round, arc, or rectangle.

In one embodiment, the hollow tube 224 is a hollow ceramic tube with a circular cross section. The diameter of the hollow ceramic tube is about 1 centimeter, and the length of the hollow ceramic tube is about 6 centimeters.

The liquid absorbing material 222 has good absorption performance The liquid absorbing material 222 can be cotton, non-woven fabrics and high absorbent resin, In one embodiment, the liquid absorbing material 222 is attached to the inner surface of the hollow tube 224.

The heating layer 226 is disposed on an outer surface of the hollow tube 224. The heating layer 226 comprises a carbon nanotube structure. The carbon nanotube structure includes a plurality of carbon nanotubes uniformly distributed therein, and the carbon nanotubes therein can be combined by van der Waals attractive force therebetween. The carbon nanotube structure can be a substantially pure structure of the carbon nanotubes, with few impurities. The carbon nanotubes can be used to form many different structures and provide a large specific surface area. The heat capacity per unit area of the carbon nanotube structure can be less than $2 \times 10-4$ $J/m^2 \cdot K$. Typically, the heat capacity per unit area of the carbon nanotube structure is less than $1.7 \times 10-6$ $J/m^2 \cdot K$. As the heat capacity of the carbon nanotube structure is very low, and the temperature of the heating element 16 can rise and fall quickly, which makes the heating layer 226 have a high heating efficiency and accuracy. As the carbon nanotube structure can be substantially pure, the carbon nanotubes are not easily oxidized and the life of the heating layer 226 will be relatively long. Further, the carbon nanotubes have a low density, about 1.35 $g/cm^3$, so the heating layer 226 is light. As the heat capacity of the carbon nanotube structure is very low, the heating layer 226 has a high response heating speed. As the carbon nanotube has large specific surface area, the carbon nanotube structure with a plurality of carbon nanotubes has large specific surface area. When the specific surface of the carbon nanotube structure is large enough, the carbon nanotube structure is adhesive and can be directly applied to the outer surface of the hollow tube 224.

The carbon nanotubes in the carbon nanotube structure can be arranged orderly or disorderly. The term 'disordered carbon nanotube structure' refers to a structure where the carbon nanotubes are arranged along many different directions, and the aligning directions of the carbon nanotubes are random. The number of the carbon nanotubes arranged along each different direction can be almost the same (e.g. uniformly disordered). The disordered carbon nanotube structure can be isotropic. The carbon nanotubes in the disordered carbon nanotube structure can be entangled with each other.

The carbon nanotube structure including ordered carbon nanotubes is an ordered carbon nanotube structure. The term 'ordered carbon nanotube structure' refers to a structure where the carbon nanotubes are arranged in a consistently systematic manner, e.g., the carbon nanotubes are arranged approximately along a same direction and/or have two or more sections within each of which the carbon nanotubes are arranged approximately along a same direction (different sections can have different directions). The carbon nanotubes in the carbon nanotube structure can be selected from a group consisting of single-walled, double-walled, and/or multi-walled carbon nanotubes.

The carbon nanotube structure can be a carbon nanotube film structure with a thickness ranging from about 0.5 nanometers to about 1 millimeter. The carbon nanotube film structure can include at least one carbon nanotube film. The carbon nanotube structure can also be a linear carbon nanotube structure with a diameter ranging from about 0.5 nanometers to about 1 millimeter. The carbon nanotube structure can also be a combination of the carbon nanotube film structure and the linear carbon nanotube structure. It is understood that any carbon nanotube structure described can be used with all embodiments. It is also understood that any carbon nanotube structure may or may not employ the use of a support structure.

Figure 3:
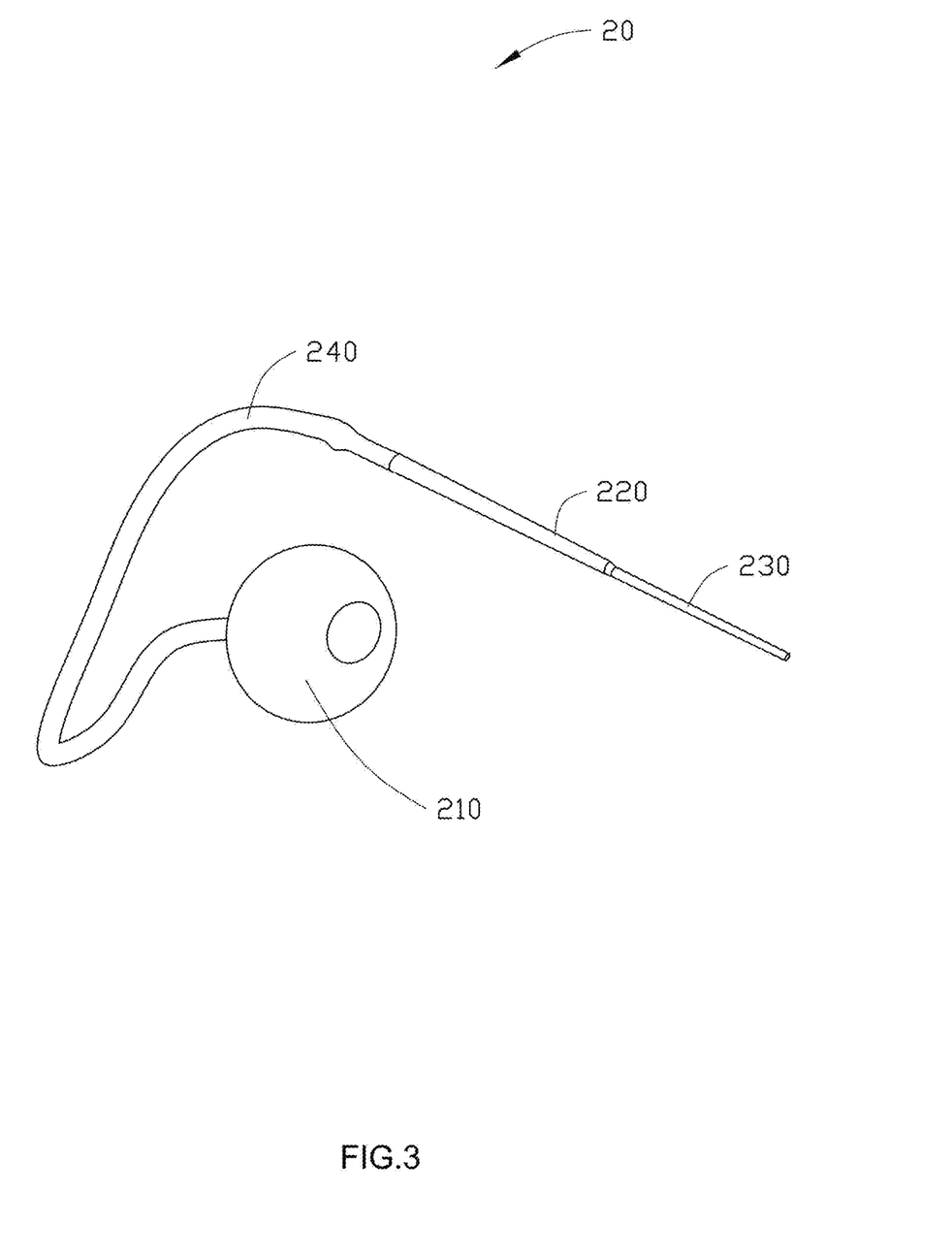
FIG. 3 is a schematic view of one embodiment of a vapor-condensation-assisted device.

In one embodiment, the carbon nanotube structure includes at least one drawn carbon nanotube film. A film can be drawn from a carbon nanotube array, to form a drawn carbon nanotube film. The drawn carbon nanotube film includes a plurality of successive and oriented carbon nanotubes joined end-to-end by van der Waals attractive, three therebetween. The drawn carbon nanotube film is a freestanding film. Each drawn carbon nanotube film includes a plurality of successively oriented carbon nanotube segments joined end-to-end by van der Waals attractive force therebetween. Each carbon nanotube segment includes a plurality of carbon nanotubes parallel to each other, and combined by van der Waals attractive force therebetween. As can be seen in FIG. 3, some variations can occur in the drawn carbon nanotube film. The carbon nanotubes 145 in the drawn carbon nanotube film are oriented along a preferred orientation. The carbon nanotube film can be treated with an organic solvent to increase the mechanical strength and toughness of the carbon nanotube film and reduce the coefficient of friction of the carbon nanotube film. A thickness of the carbon nanotube film can range from about 0.5 nanometers to about 100 micrometers.

The vapor producing device 220 further comprises two electrodes 221 located on and electrically connected to the heating layer 226. Furthermore, it is imperative that the two spaced electrodes 221 are separated from each other to prevent short circuiting of the electrodes. The two electrodes 221 can be directly electrically attached to the heating layer 226 by, for example, a conductive adhesive (not shown), such as silver adhesive. Because, some of the carbon nanotube structures have large specific surface area and are adhesive in nature, in some embodiments, the two electrodes 221 can be adhered directly to heating layer 226. It should be noted that any other bonding ways may be adopted, as long as the two electrodes 221 are electrically connected to the heating layer 226. The shape of the two electrodes 221 are not limited and can be lamellar, rod, wire, and block among other shapes.

The two electrodes 221 can be conductive films. A material of the two electrodes 221 can be metal, alloy, indium tin oxide (ITO), antimony tin oxide (ATO), conductive silver glue, conductive polymers or conductive carbon nanotubes. The metal or alloy materials can be aluminum, copper, tungsten, molybdenum, gold, titanium, neodymium, palladium, cesium or any combination of the alloy. In one embodiment, the electrode 221 is a palladium film with a thickness of 20 nanometers.

The power source 228 can be AC or DC power. The power source 228 is electrically connected to the two electrodes 221. When a voltage is applied to heating layer 226 via the two electrodes 221, the carbon nanotube structure of the heating layer 226 radiates heat at a certain wavelength. The temperature of the heating layer 226 ranges from 30° C. to 300° C., the liquid material in the liquid absorbing material 222 turns to vapor.

The vapor producing device 220 can further comprises a protecting layer 202 attached to the exposed surface of the heating layer 226. The protecting layer 202 can protect the heating layer 226 from the environment. A material of the protecting layer 202 can be an insulated material, such as resin, plastic or rubber. A thickness of the protecting layer 202 can range from about 0.5 µm to about 2 mm.

The guide pipe 230 comprises a first opening 231 and a second opening 235 opposite to the first opening 231. The diameter of the first opening 231 is smaller than the diameter of the second opening 235. Air can flow from the first opening 231 to the second opening through the guide pipe 230. The second opening 235 is sealed connected to the vapor producing device 220. The material of the guide pipe 230 is not limited, and can be soft or hard materials. The hard material can be ceramic, glass, or quartz. The soft material can be resin, rubber, plastic or flexible fiber. The cross section shape of the hollow tube 224 is also unlimited, and can be round, arc, or rectangle. In one embodiment, this example, the guide pipe 230 is a hollow ceramic tube with a circular cross section.

The air blowing device 210, the vapor producing device 220 and the guide pipe 230 are integrated with each other. The air blowing device 210 can push the air through the vapor producing device 220 and the guide pipe 230, from the first opening 231 to the nanostructure sample 60 on the stage 110.

Referring to FIG. 3, the vapor-condensation-assisted device 20 can further comprises an additional pipe 240. The additional pipe 240 is located between the vapor producing device 220 and the air blowing device 210. The vapor producing device 220 is connected to the air blowing device 210 via the additional pipe 240. The material of the additional pipe 240 is not limited, and can be soft or hard materials. The hard material can be ceramic, glass, or quartz. The soft material can be resin, rubber, plastic or flexible fiber. The stability of air flow can be enhanced by the additional pipe 240. In one embodiment, the additional pipe 240 is made of rubber, and 50 centimeters long.

When the vapor-condensation-assisted device 20 is applied, the first opening 231 of the guide pipe 230 can be immersed into liquid and inhale some liquid into the vapor producing device 220. The liquid inhaled in the vapor producing device 220 is absorbed by the liquid absorbing material 222. When the vapor producing device 220 is heated by the heating layer 226, vapor is obtained and can flow with the air flow from the air bowling device 210 to the first opening 231. The vapor is induced to the surface of the nanostructure sample 60. The liquid can be water or alcohol. In one embodiment, the liquid is water, the vapor is water vapor.

Figure 4:
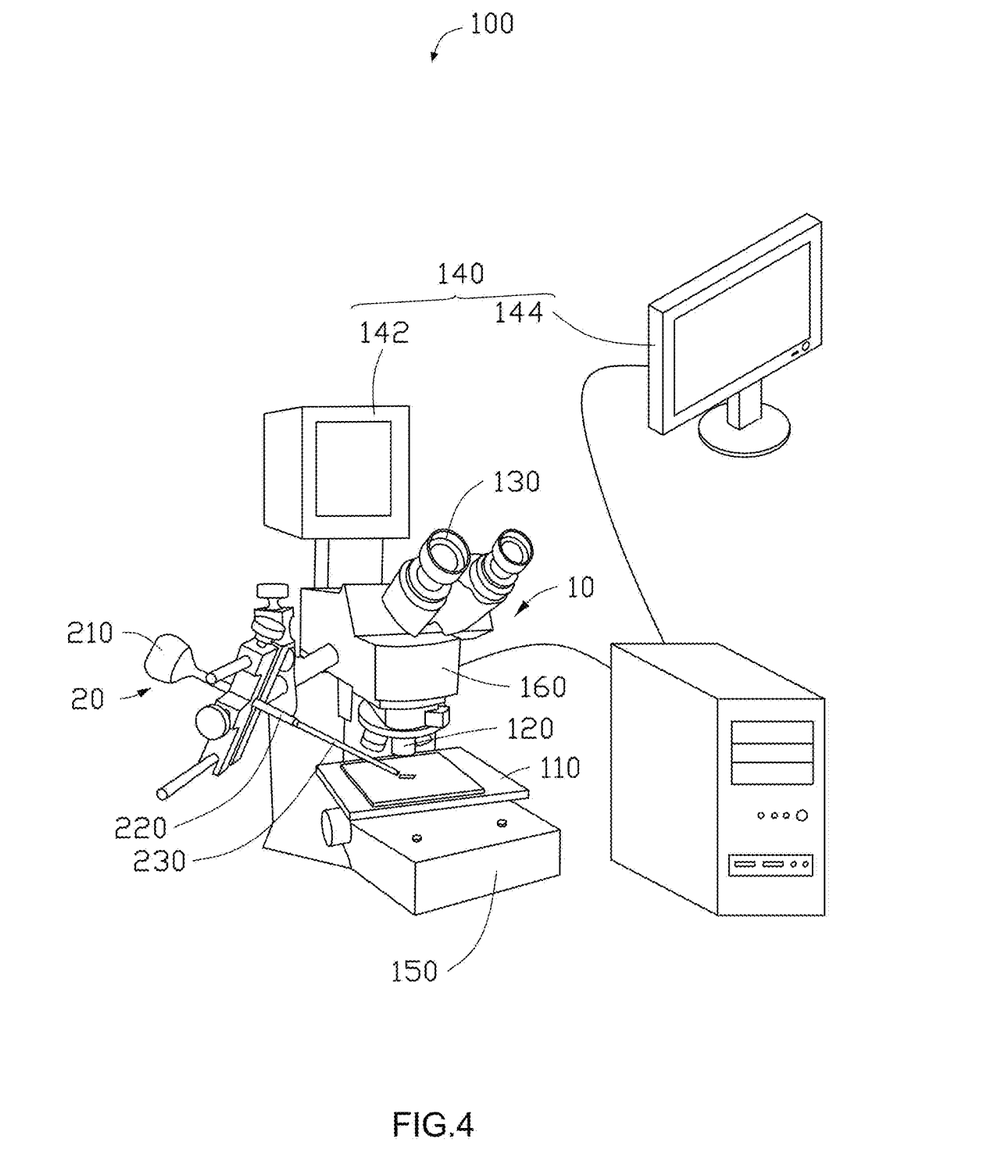
FIG. 4 is a schematic view of one embodiment of an optical microscope and a vapor-condensation-assisted device.

The optical microscope 10 can be one of various optical microscopes in existing technology. Referring to FIG. 4, in one embodiment, the optical microscope 10 comprises stage 110, objective lenses 120, eyepiece 130, and an image collecting system 140, a light source system 150 and focus adjusting system 160.

The stage 110 is a platform below the objective lenses 120 which supports the specimen being viewed. The objective lenses 120 are usually, in a cylinder housing containing a glass single or multi-element compound lens. The optical microscope 10 can comprises one or more objective lenses 120 that collect light from the specimen. In one embodiment, there are around three objective lenses 120 screwed into a circular nose piece which may be rotated to select the required objective lens 120. These arrangements are designed to be par focal, which means that when one changes from one lens to another on a microscope, the specimen stays in focus. The image collecting system 140 comprises a computer 144 and a camera 142. The focus adjusting system 160 comprises focus knobs to move the stage 110 up and down with separate adjustment for coarse and fine focusing. Many sources of light can be used as the light source system 150. At its simplest, daylight can be directed via a mirror.

The substrate 610 can be located on the stage 110. The substrate 610 can be observed by adjusting the focusing mechanism of the optical microscope system 100. The nanostructure sample 60 cannot be observed by the optical microscope system 100, when the vapor is not induced to the surface of the nanostructure sample 60. When the vapor reaches the insulated layer 614, the vapor would condense into micro-droplets which are attached to the nanostructure sample 60 and the first charged nanoparticle 620. Under oblique illumination light, the micro-droplets of water will act as scattering centers, appearing as bright dots under a dark-field optical microscope. Thus, the nanostructure sample 60 and the first charged nanoparticle 620 can be observed by the optical microscope.

A method for calculating surface electric field distribution of nanostructures of one embodiment is also provided. The method comprises the steps of:
- step (S31), providing a nanostructure sample 60 located on an insulated layer 614 of a substrate 610;
- step (S32), spraying first charged nanoparticles 620 onto the insulated layer 614, wherein the first charged nanoparticles 620 and the nanostructure sample 60 are all positively charged or all negatively charged;
- step (S33), blowing vapor to the insulated layer 614 and imaging the first charged nanoparticles 620 via an optical microscope, and recording the width w between the first charged nanoparticles 620 and the nanostructure sample 60; and
- step (S34), obtaining the voltage U of the nanostructure sample 60 by a equation $$w = \left( \frac{F_c}{32(U - U_D)D^2} \ln\left( \frac{2D/d}{2^{1/\epsilon_r}} \right) \right)^{-1/3},$$

wherein $F_c$ is the constant force from the first charged nanoparticles 620 flow, $U_0$ is the threshold voltage of the nanostructure sample 60, D is d is the thickness of the insulated layer, d is the diameter of the nanostructure sample 60, $\epsilon_r$ equals to $\epsilon/\epsilon_0$, $\epsilon$ is a permittivity of the insulated layer, and $\epsilon_0$ is a permittivity of vacuum.

In step (S32), the first charged nanoparticles 620 and the nanostructure sample 60 have the same sign. For example, if the nanostructure sample 60 is positively charged, then the first charged nanoparticles 620 applied to the insulated layer 614 is also positively charged: if the nanostructure sample 60 is negatively charged, then the first charged nanoparticles 620 applied to the insulated layer 614 is also negatively charged.

In step (S33), owing to the first charged nanoparticles 620 and the nanostructure sample 60 have the same sign, there is a dark strip between the first charged nanoparticles 620 and the nanostructure sample 60 in the optical image under the optical microscope. The width between the first charged nanoparticles 620 and the nanostructure sample 60 can be obtained by measuring the width of die dark strip.

Figure 7:
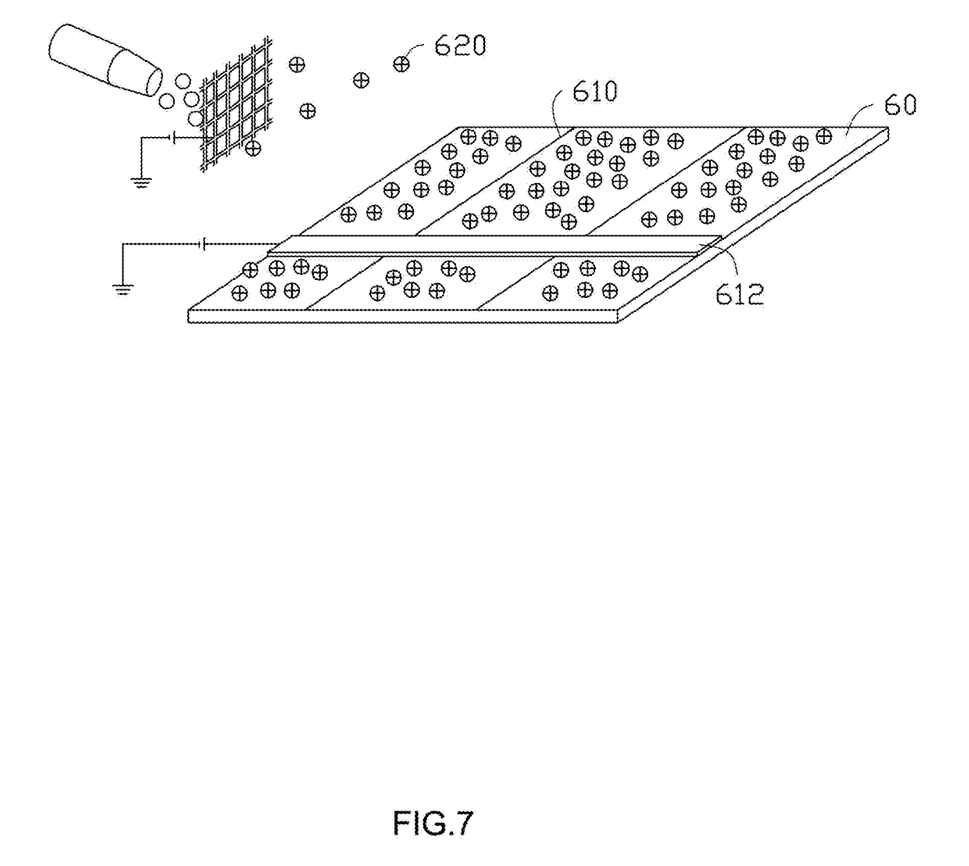
FIG. 7 is a schematic view of one embodiment of a device to study the relationship between the dark strips width and the nanostructure sample's voltage.
Figure 8:
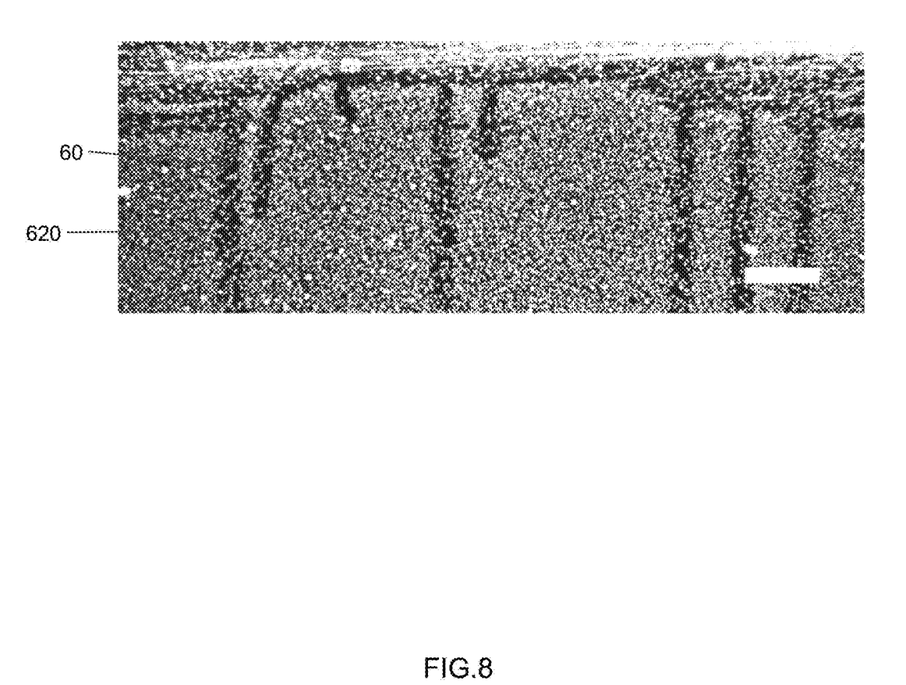
FIG. 8 is an optical image of ultra-long carbon nanotubes in accordance with FIG. 7.
Figure 9:
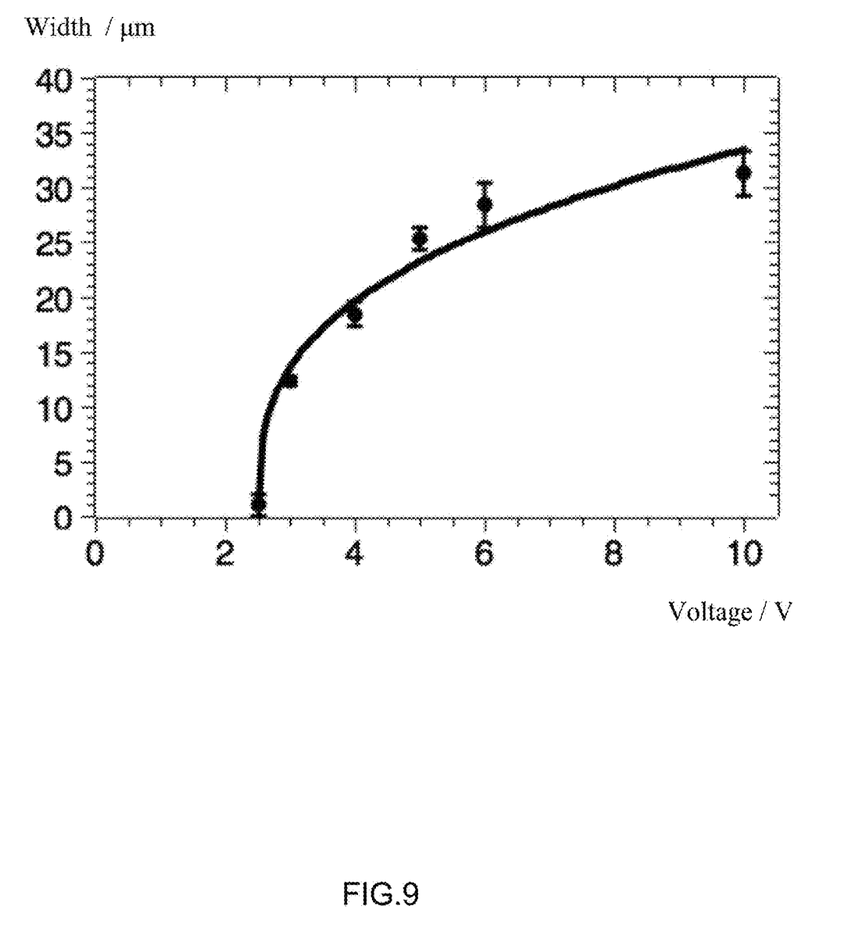
FIG. 9 is a schematic view of the relationship between the dark strips' width and nanostructure sample's voltage.
Figure 10:
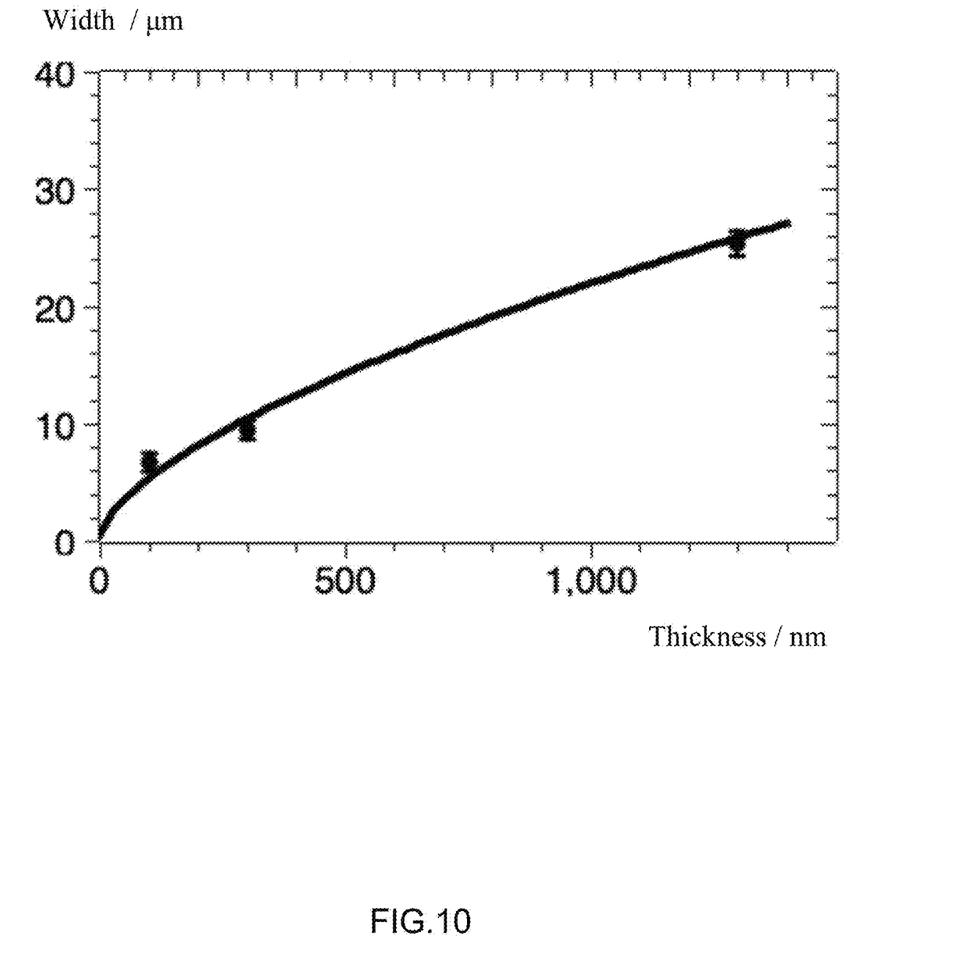
FIG. 10 is a schematic view of the relationship between the dark strips' width and the silicon dioxide layer's thickness.

In step (S34), referring to FIG. 7, the nanostructure sample 60 to be observed is ultra-long semiconducting carbon, nanotubes, the insulated layer 614 is silicon dioxide layer. To study the relationship between the width w and the voltage U of the nanostructure sample 60, the ultra-long semiconducting carbon nanotubes are connected with a positively charged electrode 612. The first charged nanoparticles 620 are also positively charged. Referring to FIG. 8, the dark strip between the first charged nanoparticles 620 and the nanostructure sample 60 reflect the positive surface charge distribution along the carbon nanotubes. Referring to FIG. 9, the dark strip become wider with the increase of the voltage applied to the charged electrode 612. Referring to FIG. 10, the dark strip become wider with the increase of the thickness of the silicon dioxide layer.

To clearly understand the mechanism, the following derivation is made.

For a cylinder electric field, the amplitude is given by $$E_c = \frac{\lambda}{2\pi\epsilon_D r}, \quad (1)$$

where $\lambda$ is the linear charge density of a CNT, $\epsilon_D$ is the permittivity of vacuum, r is the radius. Due to the influence of image charge, the total electric filed between the CNT and the conducting substrate is given by $$E = \frac{\lambda}{2\pi\epsilon_D r} + \frac{\lambda}{2\pi\epsilon(2D + d - r)}, \quad (2)$$

where D is the thickness of the silicon dioxide layer, d is the diameter of the CNT, $\epsilon$ is the permittivity of the silicon dioxide layer. Here, the influence of polarization charge is ignored. Actually, it could be reduced in $\epsilon$. Then the capacity is given by $$C = \frac{\lambda}{U} = \lambda / \int_{d/2}^{d/2+D} E dr \quad (3)$$

$$= 1 / \int_{d/2}^{d/2+D} \left( \frac{1}{2\pi\epsilon_D r} + \frac{1}{2\pi\epsilon(2D+d-r)} \right) dr$$

$$= \frac{2\pi\epsilon_D}{\ln\left(\frac{2D/d}{2^{1/\epsilon_r}}\right)},$$

where $\epsilon_r$ equals to $\epsilon/\epsilon_D$, and D>>d is used. Considering the flow is nearly constant, the boundary of dark strip is the equilibrium position of electric force and the pressure difference, the following relationship is obtained $$C(U - U_D)\left( \frac{1}{\pi\epsilon_D w} - \frac{w/2}{2\pi\epsilon_D(4D^2 + w^2/4)} \right) = F_c, \quad (4)$$

where U is the gate voltage, $U_D$ is the threshold voltage of semiconducting carbon nanotubes, w is the width of dark strips, $F_c$ is the constant force from the flow. After transformation and simplification of (4), the relationship between w and U is, where w>>D is used.

$$U = \frac{\pi\epsilon_D F_c}{16CD^2} w^3 + U_D, \quad (5)$$

The theoretical curve fits the experimental data well as shown in FIG. 9. Furthermore, The relationship between the width of dark strips and the thickness of the silicon dioxide layer is $$w = \left( \frac{F_c}{32(U - U_D)D^2} \ln\left(\frac{2D/d}{2^{1/\epsilon_r}}\right) \right)^{-1/3}. \quad (6)$$

With equation (6), FIG. 10 shows the plot and fitted curve of dark strips' width and the thickness of silicon dioxide layer. Due to the quantitative analysis, the value of the surface electric field distribution, sometimes the surface charge distribution can be obtained after calibration for other conditions.

Figure 11:
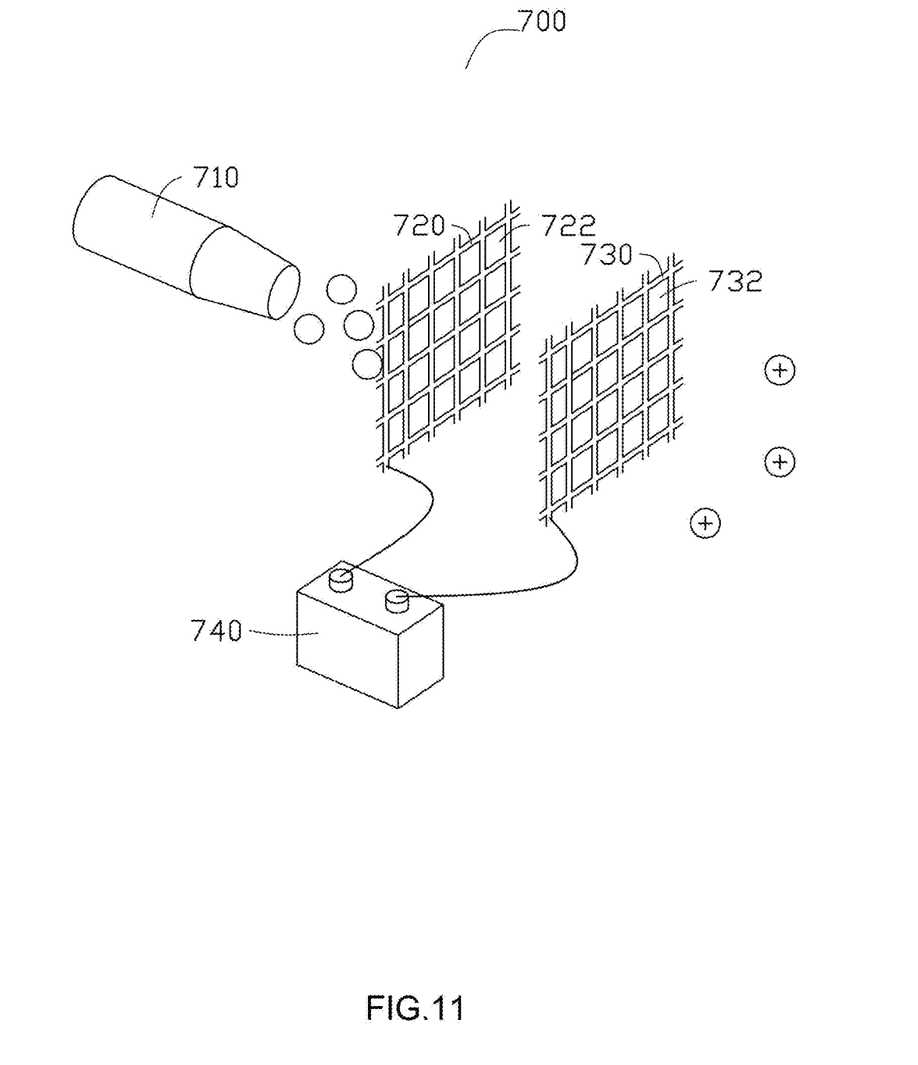
FIG. 11 is a schematic view of one embodiment of a device for making charged nanoparticles.

Referring to FIG. 11, a device 700 for making charged nanoparticles 620 of one embodiment is provided. The device 700 includes an atomizer 710, a first electrode 720, and a second electrode 730.

The atomizer 710 is configured to atomize a solution into micro-scaled droplets. In one embodiment, the solution is NaCl saturated ethanol solution, the NaCl saturated ethanol solution is converted into micro-scaled ethanol drop with saturated NaCl by the atomizer 710. The atomizer 710 can be a compressed air atomizer.

The first electrode 720 and the second electrode 730 are planar structures substantially parallel with and spaced from each other. There can be at least one first through-hole 722 is defined on the first electrode 720; similarly, there can be at least one second through-hole 732 is defined on the second electrode 730. The micro-scaled droplets atomized by the atomizer 710 can pass through the first electrode 720 and the second electrode 730 via the at least one first through-hole 722 and the at least one second through-hole 732. The charged nanoparticles 620 obtained by device 700 can have a good performance when the diameter of the at least one first through-hole 722 and the at least one second through-hole 732 is equal to or less than 1 millimeter. In one embodiment, both of the first electrode 720 and the second electrode 730 are metal-grid.

A voltage $U_{12}$ is applied between the first electrode 720 and the second electrode 730. The voltage $U_{12}$ can range from about −2000V to about +2000V. In one embodiment, the potential of the second electrode 730 is about +1800V or about −1800V. When the micro-scaled droplet atomized by the atomizer 710 is passing through the charged electrode, the electrons can transfer between the charged electrode and the micro-scaled droplets. The sign of the micro-scaled droplets depends on the sign of the charged second electrode 730. For example, the charged second electrode 730 is negative, the electrons transferred from the charged second electrode 730 to the micro-scaled droplets.

A device for making charged nanoparticles 620 of one embodiment is provided. The device includes an atomizer 710 and a metal-grid. The atomizer 710 is configured to atomize a solution into micro-scaled droplets. The metal-grid has a plurality of holes, the metal-grid is applied with a negative or positive electric potential ranged from about −2000V to about +2000V so that electrons are transferred between the metal-grid and the micro-scaled droplets when the micro-scaled droplets passing through the plurality of holes. In one embodiment, the negative or positive electric potential is about −1800V or about +1800V.

A method for making charged nanoparticles of one embodiment is further provided. The method comprises the step of:

step (S41), providing a solution;

step (S42), atomizing the solution into micro-sealed droplets;

step (S43), providing a charged electrode with at least one through-hole, the electrode is applied to a negative or positive electric potential;

step (S44), allowing the micro-scaled droplets to pass through the at least one through-hole.

In step (S41), the solution can be a saturated solution with a volatile solvent. The solute of the solution is decided by the charged nanoparticles to be prepared. The solvent of the solution can be water or ethanol. For example, to prepare charged NaCl nanoparticles the solution to be atomized can be NaCl saturated ethanol solution; or to prepare charged glucose nanoparticles the solution to be atomized can be glucose saturated ethanol solution.

In step (S42), the solution can be atomized by the atomizer 710 in one embodiment. The size of the micro-scaled droplets can be in a range from about 1 micrometer to about 10 micrometers.

In step (S43), the electric potential is a negative or positive electric potential ranged from about −2000V to about +2000V. In one embodiment, the electric potential is about −1800V or about +1800V.

In step (S44), when the micro-scaled droplets passing through the at least one through-hole, the electrons can transfer between the charged electrode and the micro-scaled droplets. The sign of the micro-scaled droplets depends on the sign of the charged electrode. For example, the charged electrode is negative, the electrons transferred from the charged electrode to the micro-scaled droplets.

Depending on the embodiment, certain of the steps of methods described may be removed, others may be added, and the sequence of steps may be altered. The description and the claims drawn to a method may include some indication in reference to certain steps. However, the indication used is only to be viewed for identification purposes and not as a suggestion as to an order for the steps.

What is claimed is:

1. A method for detecting surface electric field distribution of nanostructures, the method comprising the following steps of:
   providing a nanostructure sample located on an insulated surface of a substrate;
   spraying first charged nanoparticles to the insulated surface; and
   blowing vapor to the insulated surface to image the first charged nanoparticles via an optical microscope.

2. The method as claimed in claim 1, wherein the nanostructure sample is zero-dimensional nanomaterials, one-dimensional nanomaterials, or two-dimensional nanomaterials.

3. The method as claimed in claim 2, wherein the nanostructure sample is carbon nanotubes.

4. The method as claimed in claim 1, wherein the substrate is a silicon substrate with a silicon dioxide layers located on a surface of the silicon substrate.

5. The method as claimed in claim 1, wherein a diameter of the first charged nanoparticles ranges from about 0.5 nanometers to about 5 nanometers.

6. The method as claimed in claim 1, wherein a first charged nanoparticle are crystals difficult to sublimate.

7. The method as claimed in claim 1, wherein the first charged nanoparticles are all positively charged or all negatively charged.

8. The method as claimed in claim 1, wherein the first charged nanoparticles are charged glucose nanoparticles, charged sucrose nanoparticles or charged metal salt nanoparticles.

9. The method as claimed in claim 1, wherein the vapor is water vapor or ethanol vapor.

10. A method for detecting surface electric field distribution of nanostructures, the method comprising the following steps of:
    providing a nanostructure sample located on an insulated surface of a substrate, and a vapor-condensation-assisted optical microscope system comprising a vapor-condensation-assisted device and an optical microscope comprising a stage, wherein the vapor-condensation-assisted device configured to provide vapor;
    locating a sample on the stage;
    spraying first charged nanoparticles to the insulated surface; and
    blowing vapor to the insulated surface to image the first charged nanoparticles via an optical microscope.

11. The method as claimed in claim 10, wherein the vapor-condensation-assisted device comprises an air blowing device, a vapor producing device and a guide pipe connected with each other; and the air blowing device blows air through the vapor producing device into the guide pipe.

* * * * *